United States Patent
Shim et al.

(10) Patent No.: US 10,298,214 B2
(45) Date of Patent: May 21, 2019

(54) CLOCK SWITCH DEVICE AND SYSTEM-ON-CHIP HAVING THE SAME

(71) Applicant: SAMSUNG ELECTRONICS CO., LTD., Suwon-si, Gyeonggi-do (KR)

(72) Inventors: Hye-Won Shim, Seoul (KR); Dong-Uk Park, Hwaseong-si (KR); Phil-Jae Jeon, Hwaseong-si (KR); Sang-Woo Pae, Seongnam-si (KR); Da Ahn, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/584,448

(22) Filed: May 2, 2017

(65) Prior Publication Data

US 2018/0091122 A1  Mar. 29, 2018

(30) Foreign Application Priority Data

Sep. 27, 2016 (KR) ........................ 10-2016-0123836

(51) Int. Cl.
*G06F 1/04* (2006.01)
*H03K 3/66* (2006.01)
*H03K 5/19* (2006.01)
*H03K 19/00* (2006.01)
*H03K 5/135* (2006.01)

(52) U.S. Cl.
CPC ................ *H03K 3/66* (2013.01); *G06F 1/04* (2013.01); *H03K 5/135* (2013.01); *H03K 5/19* (2013.01); *H03K 19/0002* (2013.01)

(58) Field of Classification Search
CPC .. H03K 3/64; H03K 3/66; H03K 3/70; H03K 5/19; H03K 19/0002; G01R 23/00; G01R 23/005; G01R 23/02; G01R 23/15
See application file for complete search history.

(56) References Cited

U.S. PATENT DOCUMENTS

| | | | |
|---|---|---|---|
| 4,988,955 A * | 1/1991 | Horie .................. | G06F 1/08 331/11 |
| 6,346,828 B1 | 2/2002 | Rosen et al. | |
| 6,583,648 B1 | 6/2003 | Cai | |
| 7,215,207 B2 * | 5/2007 | Hsieh .................. | H03L 7/087 331/14 |
| 7,626,438 B2 | 12/2009 | Mari et al. | |
| 7,772,910 B2 | 8/2010 | Lee et al. | |
| 9,317,048 B2 | 4/2016 | Kuang et al. | |
| 9,395,795 B2 * | 7/2016 | Warren ................. | G06F 1/325 |
| 2008/0252329 A1 | 10/2008 | Muniandy et al. | |
| 2014/0218090 A1 * | 8/2014 | Bartling ................ | H03K 3/289 327/203 |
| 2014/0253204 A1 | 9/2014 | Rozen et al. | |
| 2014/0292372 A1 | 10/2014 | Gururajarao | |

* cited by examiner

*Primary Examiner* — Lincoln D Donovan
*Assistant Examiner* — Diana J. Cheng
(74) *Attorney, Agent, or Firm* — Lee & Morse P.C.

(57) ABSTRACT

A clock switch device includes a control circuit and a tri-state buffer. The control circuit deactivates an output enable signal when a frequency of a clock signal varies and activates the output enable signal when the frequency of the clock signal is maintained without change. The tri-state buffer maintains an output electrode at a high impedance state when the output enable signal is deactivated and buffers the clock signal and outputs the buffered clock signal through the output electrode as an output clock signal when the output enable signal is activated.

20 Claims, 8 Drawing Sheets

CLOCK SWITCH DEVICE AND SYSTEM-ON-CHIP HAVING THE SAME

CROSS-REFERENCE TO RELATED APPLICATION

Korean Patent Application No. 10-2016-0123836, filed on Sep. 27, 2016, and entitled, "Clock Switch Device and System-On-Chip Having the Same," is incorporated by reference herein in its entirety.

BACKGROUND

1. Field

One or more embodiments described herein relate to a clock switch device and a system-on-chip including a clock switch device.

2. Description of the Related Art

In some systems, the frequency of a clock signal may vary during a stabilization time and then may be maintained at a target frequency after the stabilization time. A semiconductor device may then be operated in synchronization with the clock signal within an allowable frequency range. When the frequency of the clock signal exceeds the allowable range, reliability of the semiconductor device may decrease.

SUMMARY

In accordance with one or more embodiments, a clock switch device includes a control circuit to deactivate an output enable signal when a frequency of a clock signal varies and to activate the output enable signal when the frequency of the clock signal is maintained without change; and a tri-state buffer to maintain an output electrode at a high impedance state when the output enable signal is deactivated and to buffer the clock signal and output the buffered clock signal through the output electrode as an output clock signal when the output enable signal is activated.

In accordance with one or more other embodiments, a system-on-chip includes a clock signal generator to generate a clock signal; a clock switch device to stop outputting the clock signal when a frequency of the clock signal varies and to buffer the clock signal and output the buffered clock signal as an output clock signal when the frequency of the clock signal is maintained without change; and a functional block to operate in synchronization with the output clock signal.

In accordance with one or more other embodiments, an apparatus includes first logic to output a first control signal when a frequency of a clock signal is in a first state; and second logic to output a second control signal when the frequency of the clock signal is in a second state, wherein the first state corresponds to when the clock signal varies and the second state corresponds to when the clock signal is maintained.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
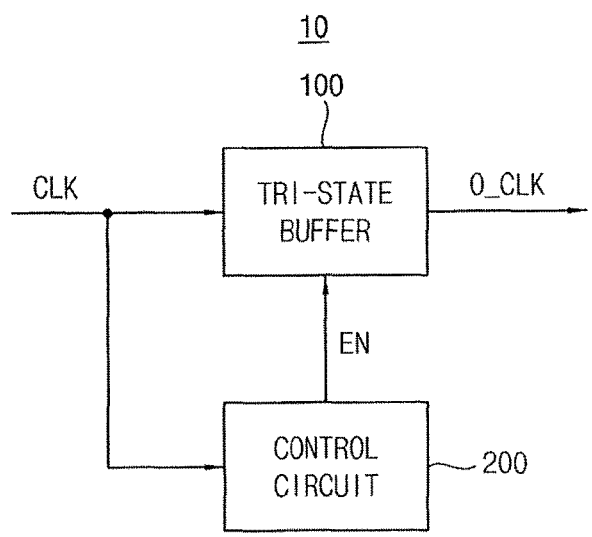
FIG. 1 illustrates an embodiment of a clock switch device.

FIG. 1 illustrates an embodiment of a clock switch device 10 which receives a clock signal CLK from an external device. For example, the clock switch device 10 may receive the clock signal CLK generated by a clock signal generator such as a phase locked loop (PLL). The clock switch device 10 stops outputting the clock signal CLK when the frequency of the clock signal CLK varies. The clock switch device 10 buffers the clock signal CLK and then outputs the buffered clock signal as an output clock signal O_CLK when the frequency of the clock signal CLK is maintained without change. Thus, the output clock signal O_CLK output by the clock switch device 10 may have a constant frequency.

In one embodiment, the clock signal O_CLK output by the clock switch device 10 may be provided to a functional block. The functional block may operate in synchronization with the output clock signal O_CLK.

Referring to FIG. 1, the clock switch device 10 may include a tri-state buffer 100 and a control circuit 200. The control circuit 200 may receive the clock signal CLK. The control circuit 200 may deactivate an output enable signal EN when the frequency of the clock signal CLK varies. On the other hand, the control circuit 200 may activate the output enable signal EN when the frequency of the clock signal CLK is maintained without change.

The tri-state buffer 100 may receive the clock signal CLK. The tri-state buffer 100 may maintain an output electrode at a high impedance state when the output enable signal EN is deactivated. On the other hand, the tri-state buffer 100 may buffer the clock signal CLK and then output the buffered clock signal through the output electrode as the output clock signal O_CLK when the output enable signal EN is activated.

Figure 2:
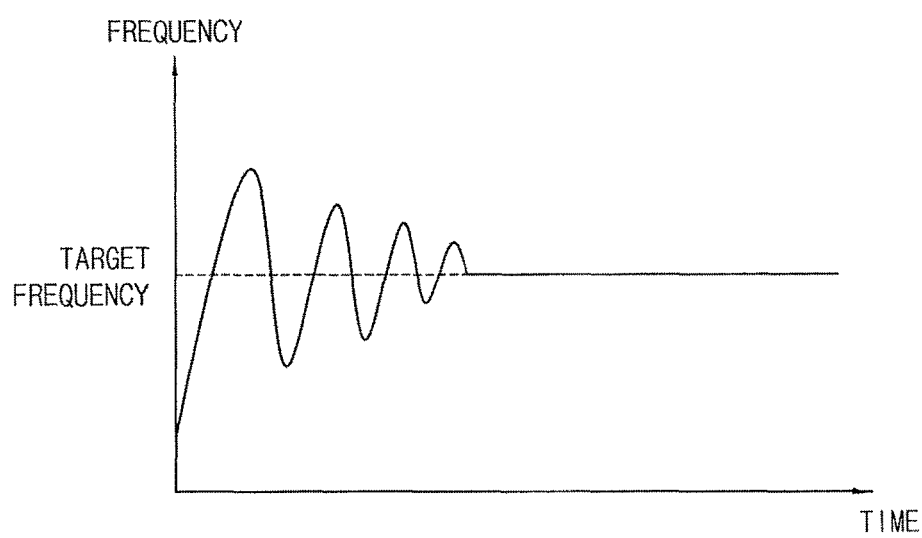
FIG. 2 illustrates an example of a change in the frequency of a clock signal provided to the clock switch device.

FIG. 2 illustrates an example of a change in frequency of a clock signal provided to the clock switch device in FIG. 1. The clock switch device 10 may receive the clock signal CLK generated by a clock signal generator, e.g., a phase locked loop (PLL).

Referring to FIG. 2, the frequency of the clock signal CLK may vary during a stabilization time, e.g., from a time at which the clock signal generator starts to generate the clock signal CLK. The frequency of the clock signal CLK may be stabilized at a target frequency after the stabilization time.

When the clock signal CLK is provided to the functional block (e.g., which includes a semiconductor element such as a transistor) directly from the clock signal generator, the functional block may receive the clock signal CLK having a frequency higher than the target frequency during the stabilization time.

A semiconductor device operating in synchronization with a clock signal may have an allowable range of a frequency of the clock signal. When the frequency of the clock signal exceeds the allowable range, a hot carrier injection (HCI) may occur in the semiconductor device. Therefore, when the clock signal CLK is provided to the functional block directly from the clock signal generator, a hot carrier injection (HCI) may occur in the functional block during the stabilization time. As a result, the reliability of operation of the functional block may decrease.

In accordance with one embodiment, the clock switch device 10 may stop outputting the clock signal CLK while the frequency of the clock signal CLK varies, and may buffer the clock signal CLK and output the buffered clock signal as the output clock signal O_CLK after the frequency of the clock signal CLK is stabilized at the target frequency. Therefore, the frequency of the output clock signal O_CLK output by the clock switch device 10 may be maintained at the target frequency. Accordingly, the reliability of operation of the functional block, which operates in synchronization with the output clock signal O_CLK, may effectively increase.

Figure 3:
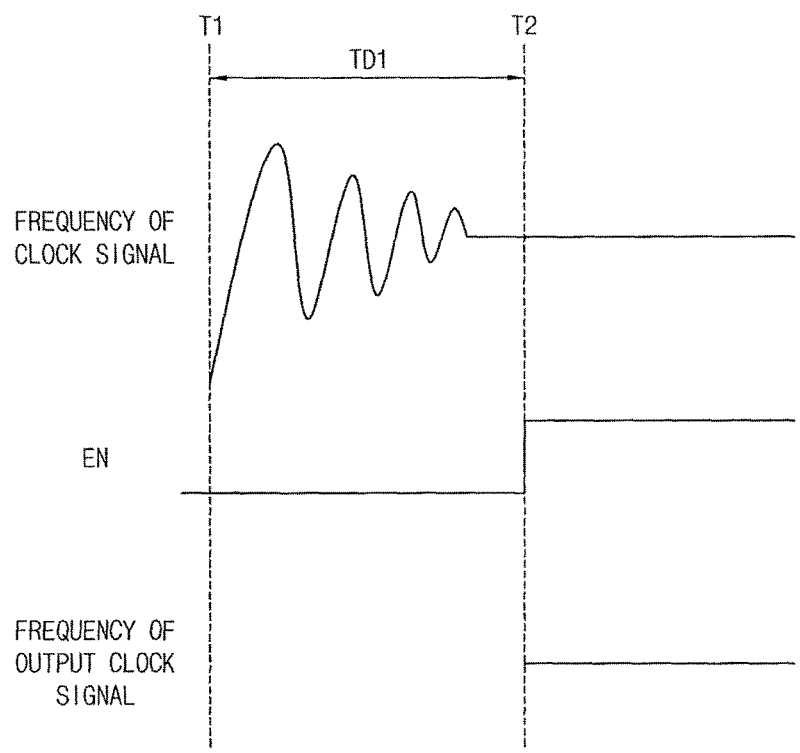
FIG. 3 illustrates an example of the operation of the clock switch device.

FIG. 3 illustrates an example of the operation of the clock switch device in FIG. 1. Referring to FIG. 3, the control circuit 200 may start to receive the clock signal CLK from the external device at a first time T1. The control circuit 200 may deactivate the output enable signal EN when the control circuit 200 starts to receive the clock signal CLK. The control circuit 200 may activate the output enable signal EN at a second time T2, which corresponds to a time after a first time duration TD1 from the first time T1 at which the control circuit 200 starts to receive the clock signal CLK. The first time duration TD1 may be longer than a stabilization time to stabilize the clock signal CLK at the target frequency.

In some example embodiments, the first time duration TD1 may be prestored in a register in the control circuit 200. In other example embodiments, the control circuit 200 may receive the first time duration TD1 from an external device.

The tri-state buffer 100 may stop outputting the clock signal CLK and maintain the output electrode at a high impedance state until the second time T2 during which the output enable signal EN is deactivated. The tri-state buffer 100 may buffer the clock signal CLK and then output the buffered clock signal through the output electrode as the output clock signal O_CLK after the second time T2 during which the output enable signal EN is activated.

Therefore, as illustrated in FIG. 3, the tri-state buffer 100 may not output the output clock signal O_CLK until the second time T2 during which the output enable signal EN is deactivated, and may output the output clock signal O_CLK with a constant frequency after second time T2 during which the output enable signal EN is activated.

Figure 4:
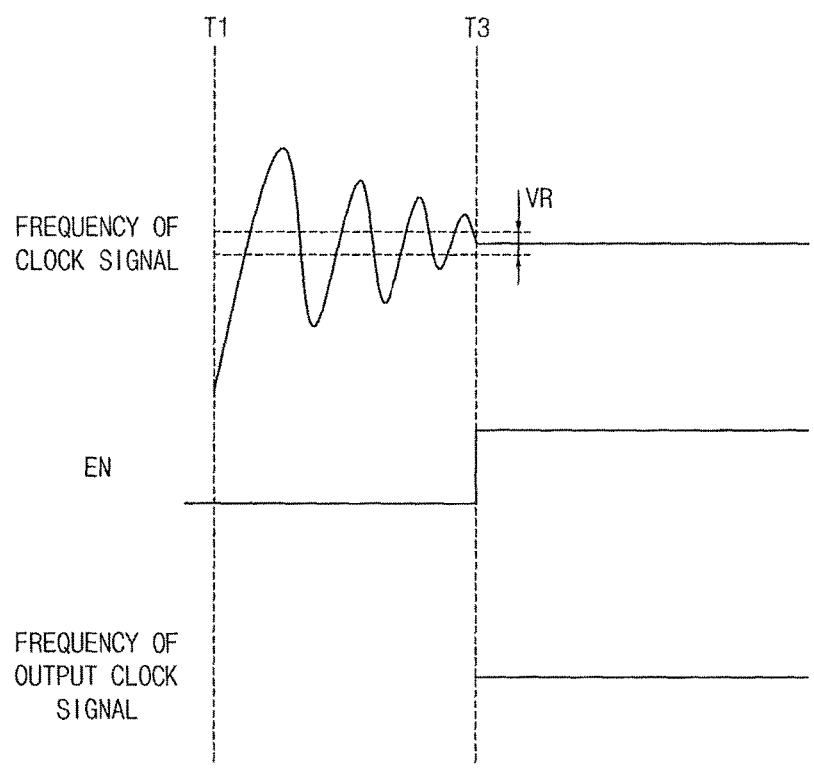
FIG. 4 illustrates another example of the operation of the clock switch device.

FIG. 4 illustrates another example of the operation of the clock switch device of FIG. 1. Referring to FIG. 4, the control circuit 200 may start to receive the clock signal CLK from the external device at a first time T1. The control circuit 200 may detect the frequency of the clock signal CLK when the control circuit 200 receives the clock signal CLK. According to example embodiments, the control circuit 200 may detect the frequency of the clock signal CLK in various ways.

The control circuit 200 may deactivate the output enable signal EN when the change amount of the frequency of the clock signal CLK per unit time is equal to or greater than a reference amount VR. On the other hand, the control circuit 200 may activate the output enable signal EN when the change amount of the frequency of the clock signal CLK per unit time is less than the reference amount VR.

For example, as illustrated in FIG. 4, the change amount of the frequency of the clock signal CLK per unit time may be greater than the reference amount VR from the first time T1, at which the control circuit 200 starts to receive the clock signal CLK, to a third time T3. Therefore, the control circuit 200 may deactivate the output enable signal EN from the first time T1 to the third time T3. On the other hand, as illustrated in FIG. 4, the change amount of the frequency of the clock signal CLK per unit time may be less than the reference amount VR after the third time T3. Therefore, the control circuit 200 may activate the output enable signal EN after the third time T3.

In some example embodiments, the reference amount VR may be prestored in a register in the control circuit 200. In other example embodiments, the control circuit 200 may receive the reference amount VR from an external device.

The tri-state buffer 100 may stop outputting the clock signal CLK and maintain the output electrode at a high impedance state until the third time T3 during which the output enable signal EN is deactivated. The tri-state buffer 100 may buffer the clock signal CLK and then output the buffered clock signal through the output electrode as the output clock signal O_CLK after the third time T3 during which the output enable signal EN is activated.

Therefore, as illustrated in FIG. 4, the tri-state buffer 100 may not output the output clock signal O_CLK until the third time T3 during which the output enable signal EN is deactivated, and may output the output clock signal O_CLK with a constant frequency after the third time T3 during which the output enable signal EN is activated.

Figure 5:
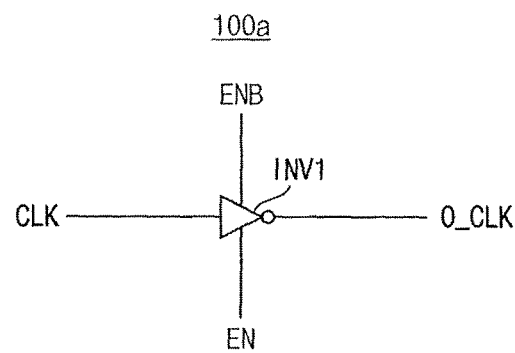
FIG. 5 illustrates an embodiment of a tri-state buffer in the clock switch device.

FIG. 5 illustrates an example of a tri-state buffer in the clock switch device of FIG. 1. Referring to FIG. 5, a tri-state buffer 100a may include a first inverter INV1. When the first inverter INV1 is turned on based on the output enable signal EN and an inverted version ENB of the output enable signal EN, the first inverter INV1 may generate the output clock signal O_CLK by inverting the clock signal CLK.

In some example embodiments, the control circuit 200 may provide the output enable signal EN and the inverted version ENB of the output enable signal EN to the tri-state buffer 100a. In other example embodiments, the tri-state buffer 100a may generate the inverted version ENB of the output enable signal EN by inverting the output enable signal EN received from the control circuit 200.

When the output enable signal EN and the inverted version ENB of the output enable signal EN are deactivated, the first inverter INV1 may be turned off. In this case, the first inverter INV1 may not generate the output clock signal O_CLK. On the other hand, when the output enable signal EN and the inverted version ENB of the output enable signal EN are activated, the first inverter INV1 may be turned on. In this case, the first inverter INV1 may invert the clock signal CLK to generate the output clock signal O_CLK.

Figure 6:
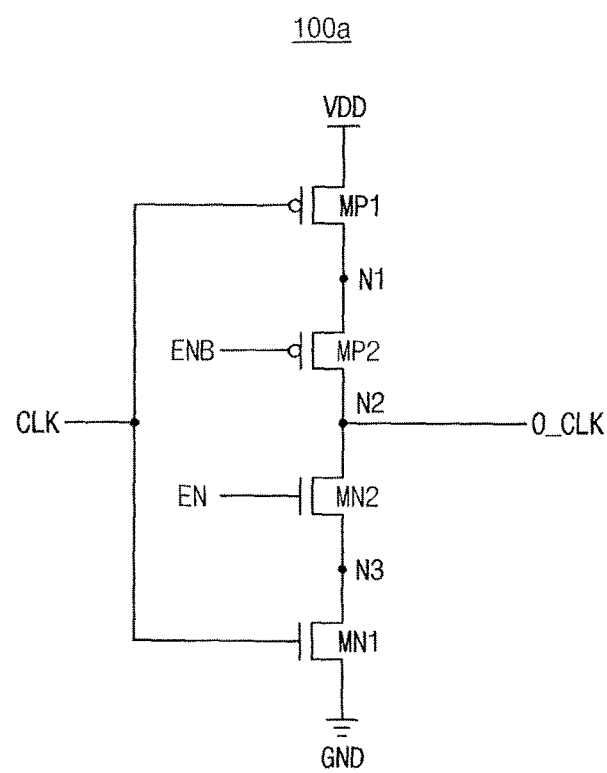
FIG. 6 illustrates an example of the tri-state buffer in FIG. 5.

FIG. 6 illustrates an example of the tri-state buffer in FIG. 5. The tri-state buffer 100a of FIG. 5 may be implemented with the circuit of FIG. 6. Referring to FIG. 6, the tri-state buffer 100a may include a first p-type metal oxide semiconductor (PMOS) transistor MP1, a second PMOS transistor MP2, a first n-type metal oxide semiconductor (NMOS) transistor MN1, and a second NMOS transistor MN2.

The first PMOS transistor MP1 may include a source coupled to a supply voltage VDD, a drain coupled to a first node N1, and a gate to receive clock signal CLK.

The second PMOS transistor MP2 may include a source coupled to the first node N1, a drain coupled to a second node N2, which corresponds to the output electrode of the tri-state buffer 100a, and a gate to receive the inverted version ENB of the output enable signal EN.

The first NMOS transistor MN1 may include a source coupled to ground voltage GND, a drain coupled to a third node N3, and a gate to receive clock signal CLK.

The second NMOS transistor MN2 may include a source coupled to the third node N3, a drain coupled to the second node N2, and a gate to receive the output enable signal EN.

When the output enable signal EN is deactivated at a logic low level and the inverted version ENB of the output enable signal EN is deactivated at a logic high level, the second NMOS transistor MN2 and the second PMOS transistor MP2 may be turned off. In this case, the second node N2, which corresponds to the output electrode of the tri-state buffer 100a, may be maintained at a high impedance state.

When the output enable signal EN is activated at a logic high level and the inverted version ENB of the output enable signal EN is activated at a logic low level, the second NMOS transistor MN2 and the second PMOS transistor MP2 may be turned on. In this case, the tri-state buffer 100a may invert the clock signal CLK and output the inverted clock signal through the second node N2 as the output clock signal O_CLK.

Figure 7:
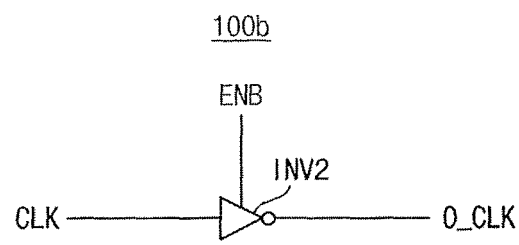
FIG. 7 illustrates another embodiment of a tri-state buffer.

FIG. 7 illustrates another embodiment of a tri-state buffer in the clock switch device of FIG. 1. Referring to FIG. 7, a tri-state buffer 100b may include a second inverter INV2. When the second inverter INV2 is turned on based on an inverted version ENB of the output enable signal EN, the second inverter INV2 may generate the output clock signal O_CLK by inverting the clock signal CLK.

In some example embodiments, the control circuit 200 may provide the inverted version ENB of the output enable signal EN to the tri-state buffer 100b. In other example embodiments, tri-state buffer 100b may generate the inverted version ENB of the output enable signal EN by inverting the output enable signal EN from the control circuit 200.

When the inverted version ENB of the output enable signal EN is deactivated, the second inverter INV2 may be turned off. In this case, the second inverter INV2 may not generate the output clock signal O_CLK. On the other hand, when the inverted version ENB of the output enable signal EN is activated, the second inverter INV2 may be turned on. In this case, the second inverter INV2 may invert the clock signal CLK to generate the output clock signal O_CLK.

Figure 8:
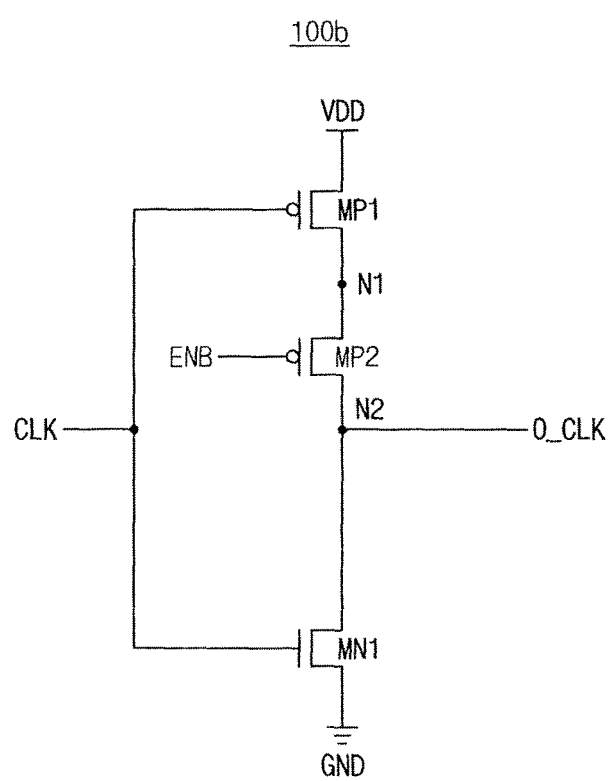
FIG. 8 illustrates an example of the tri-state buffer of FIG. 7.

FIG. 8 illustrates an example of the tri-state buffer in FIG. 7. For example, the tri-state buffer 100b of FIG. 7 may be implemented with the circuit of FIG. 8. Referring to FIG. 8, the tri-state buffer 100b may include a first PMOS transistor MP1, a second PMOS transistor MP2, and a first NMOS transistor MN1.

The first PMOS transistor MP1 may include a source coupled to a supply voltage VDD, a drain coupled to a first node N1, and a gate to receive clock signal CLK.

The second PMOS transistor MP2 may include a source coupled to the first node N1, a drain coupled to a second node N2, which corresponds to the output electrode of the tri-state buffer 100b, and a gate to receive the inverted version ENB of the output enable signal EN.

The first NMOS transistor MN1 may include a source coupled to a ground voltage GND, a drain coupled to the second node N2, and a gate to receive the clock signal CLK.

When the inverted version ENB of the output enable signal EN is deactivated at a logic high level, the second PMOS transistor MP2 may be turned off. In this case, the second node N2, which corresponds to the output electrode of the tri-state buffer 100b, may be maintained at a high impedance state. On the other hand, when the inverted version ENB of the output enable signal EN is activated sy a logic low level, the second PMOS transistor MP2 may be turned on. In this case, the tri-state buffer 100b may invert the clock signal CLK to output the inverted clock signal through the second node N2 as the output clock signal O_CLK.

Figure 9:
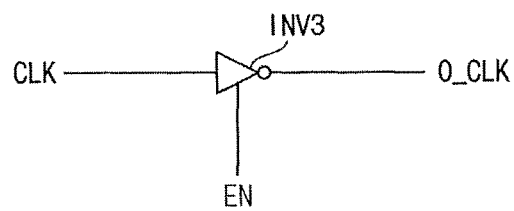
FIG. 9 illustrates another embodiment of a tri-state buffer.

FIG. 9 illustrates another embodiment of a tri-state buffer in the clock switch device of FIG. 1. Referring to FIG. 9, a tri-state buffer 100c may include a third inverter INV3. When the third inverter INV3 is turned on based on the output enable signal EN, the third inverter INV3 may generate the output clock signal O_CLK by inverting the clock signal CLK. When the output enable signal EN is deactivated, the third inverter INV3 may be turned off. In this case, the third inverter INV3 may not generate the output clock signal O_CLK. On the other hand, when the output enable signal EN is activated, the third inverter INV3 may be turned on. In this case, the third inverter INV3 may invert the clock signal CLK to generate the output clock signal O_CLK.

Figure 10:
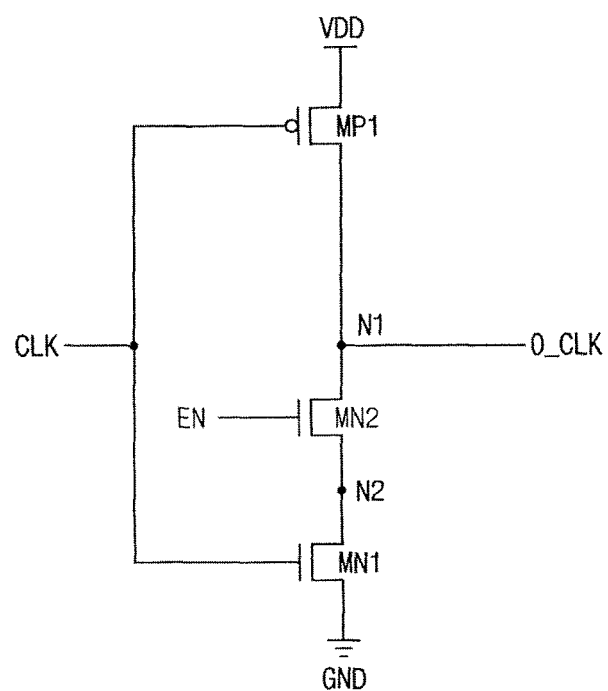
FIG. 10 illustrates an example of the tri-state buffer in FIG. 9.

FIG. 10 illustrates an example of the tri-state buffer in FIG. 9. The tri-state buffer 100c of FIG. 9 may be implemented with the circuit of FIG. 10.

Referring to FIG. 10, the tri-state buffer 100c may include a first PMOS transistor MP1, a first NMOS transistor MN1, and a second NMOS transistor MN2. The first PMOS transistor MP1 may include a source coupled to a supply voltage VDD, a drain coupled to a first node N1, which corresponds to the output electrode of the tri-state buffer 100c, and a gate to receive the clock signal CLK. The first NMOS transistor MN1 may include a source coupled to ground voltage GND, a drain coupled to a second node N2, and a gate to receive the clock signal CLK. The second NMOS transistor MN2 may include a source coupled to the second node N2, a drain coupled to the first node N1, and a gate to receive the output enable signal EN.

When the output enable signal EN is deactivated at a logic low level, the second NMOS transistor MN2 may be turned off. In this case, the first node N1, which corresponds to the output electrode of the tri-state buffer 100c, may be maintained at a high impedance state. On the other hand, when the output enable signal EN is activated at a logic high level, the second NMOS transistor MN2 may be turned on. In this case, the tri-state buffer 100c may invert the clock signal CLK and output the inverted clock signal through the first node N1 as the output clock signal O_CLK.

Figure 11:
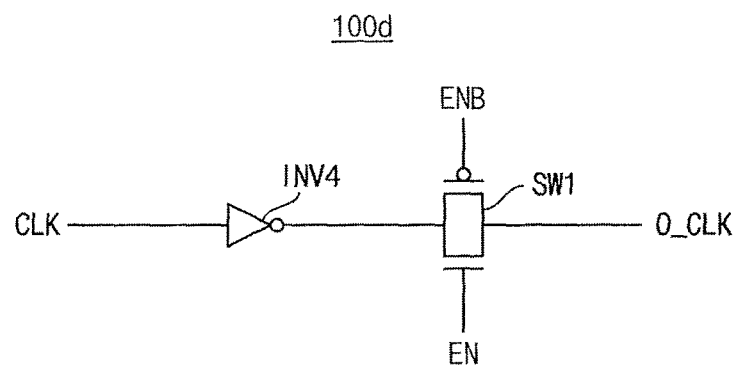
FIG. 11 illustrates another embodiment of a tri-state buffer.

FIG. 11 illustrates another embodiment of a tri-state buffer in the clock switch device of FIG. 1. Referring to FIG. 11, a tri-state buffer 100d may include a fourth inverter INV4 and a first switch SW1. The fourth inverter INV4 may invert the clock signal CLK. When the first switch SW1 is turned on based on the output enable signal EN and an inverted version ENB of the output enable signal EN, the first switch SW1 may pass the output signal of the fourth inverter INV4 as the output clock signal O_CLK.

In some example embodiments, the control circuit 200 may provide the output enable signal EN and the inverted version ENB of the output enable signal EN to the tri-state buffer 100d. In other example embodiments, the tri-state buffer 100d may generate the inverted version ENB of the output enable signal EN by inverting the output enable signal EN from the control circuit 200.

When the output enable signal EN and the inverted version ENB of the output enable signal EN are deactivated, the first switch SW1 may be turned off. In this case, the tri-state buffer 100d may not generate the output clock signal O_CLK. On the other hand, when the output enable signal EN and the inverted version ENB of the output enable signal EN are activated, the first switch SW1 may be turned on. In this case, the inverted clock signal, which is generated by the fourth inverter INV4, may be output through the first switch SW1 as the output clock signal O_CLK.

Figure 12:
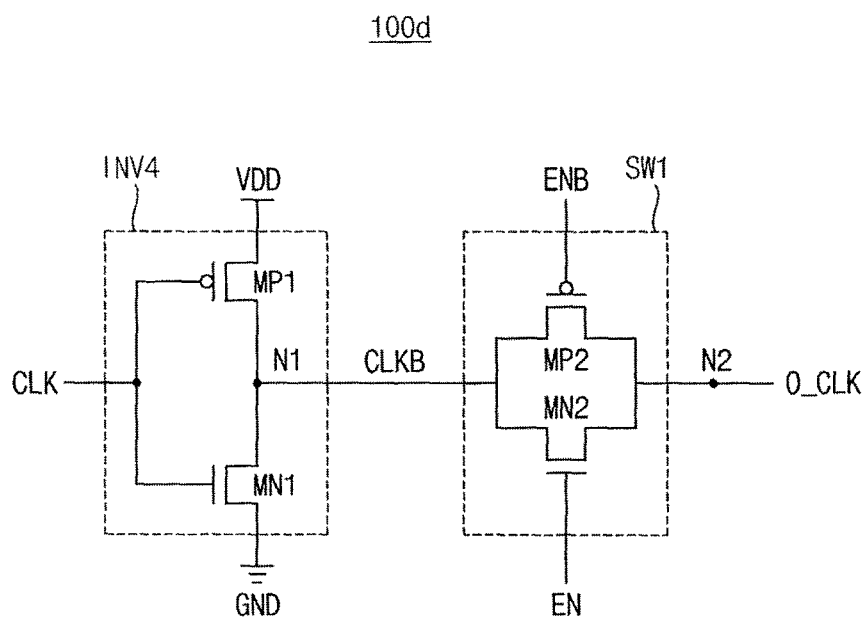
FIG. 12 illustrates an example of the tri-state buffer in FIG. 11.

FIG. 12 illustrates an example of the tri-state buffer in FIG. 11, e.g., the tri-state buffer 100d of FIG. 11 may be implemented with the circuit of FIG. 12. Referring to FIG. 12, the tri-state buffer 100d may include a first PMOS transistor MP1, a second PMOS transistor MP2, a first NMOS transistor MN1, and a second NMOS transistor MN2. The first PMOS transistor MP1 may include a source coupled to a supply voltage VDD, a drain coupled to a first node N1, and a gate to receive the clock signal CLK. The first NMOS transistor MN1 may include a source coupled to a ground voltage GND, a drain coupled to the first node N1, and a gate to receive the clock signal CLK. As illustrated in FIG. 12, the first PMOS transistor MP1 and the first NMOS transistor MN1 may correspond to the fourth inverter INV4.

The second PMOS transistor MP2 may include a source coupled to the first node N1, a drain coupled to a second node N2, which corresponds to the output electrode of the tri-state buffer 100d, and a gate to receive the inverted version ENB of the output enable signal EN. The second NMOS transistor MN2 may include a source coupled to the first node N1, a drain coupled to the second node N2, and a gate to receive the output enable signal EN. As illustrated in FIG. 12, the second PMOS transistor MP2 and the second NMOS transistor MN2 may correspond to the first switch SW1.

When the output enable signal EN is deactivated at a logic low level and the inverted version ENB of the output enable signal EN is deactivated at a logic high level, the second NMOS transistor MN2 and the second PMOS transistor MP2 may be turned off. In this case, the second node N2, which corresponds to the output electrode of the tri-state buffer 100d, may be maintained at a high impedance state.

When the output enable signal EN is activated in a logic high level and the inverted version ENB of the output enable signal EN is activated at a logic low level, the second NMOS transistor MN2 and the second PMOS transistor MP2 may be turned on. In this case, the tri-state buffer 100d may invert the clock signal CLK to output the inverted clock signal through the second node N2 as the output clock signal O_CLK.

Figure 13:
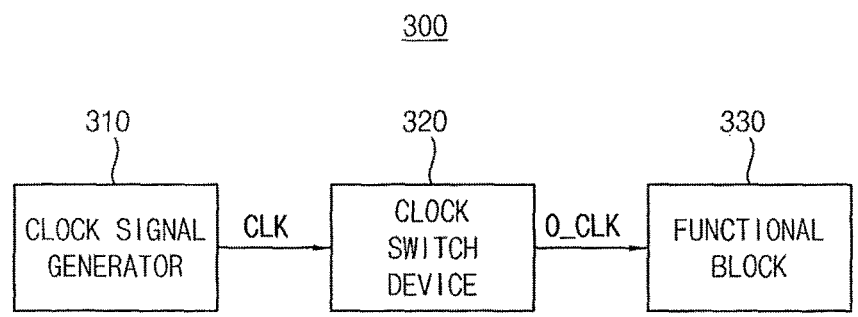
FIG. 13 illustrates an embodiment of a system-on-chip.

FIG. 13 illustrates an embodiment of a system-on-chip 300 including a clock signal generator 310, a clock switch device 320, and a functional block 330. The clock signal generator 310 generates a clock signal CLK. In some example embodiments, the clock signal generator 310 may correspond to a phase locked loop (PLL). The clock signal generator 310 may have a different structure in another embodiment.

As described above with reference to FIG. 2, the frequency of the clock signal CLK may vary during a stabilization time, from a time at which the clock signal generator 310 starts to generate the clock signal CLK. The frequency of the clock signal CLK may be stabilized at a target frequency after the stabilization time.

The clock switch device 320 receives the clock signal CLK generated by the clock signal generator 310. The clock switch device 320 stops outputting the clock signal CLK when the frequency of the clock signal CLK varies, and buffers the clock signal CLK and outputs the buffered clock signal as an output clock signal O_CLK when the frequency of the clock signal CLK is maintained without change. Therefore, the clock signal O_CLK output by the clock switch device 320 may have a constant frequency. The clock switch device 320 in the system-on-chip 300 may be implemented with the clock switch device 10 in FIG. 1.

The functional block 330 operates in synchronization with the output clock signal O_CLK. The functional block 330 may be any semiconductor devices operating in synchronization with the output clock signal O_CLK. For example, the functional block 330 may be a microprocessor, a central process unit (CPU), an image sensor, a display drive circuit, or the like.

A semiconductor device operates in synchronization with a clock signal in allowable range of a frequency of the clock signal. When the frequency of the clock signal exceeds the allowable range, a hot carrier injection (HCI) may occur in the semiconductor device. As described above with reference to FIG. 2, the clock signal CLK generated by the clock signal generator 310 may have a high frequency during a stabilization time at an initial stage of a generation. Therefore, when the clock signal CLK is provided to the functional block 330 directly from the clock signal generator 310, a hot carrier injection (HCI) may occur in the functional block 330 during the stabilization time. Thus, reliability of operation of functional block 330 may decrease.

In accordance with one embodiment, in the system-on-chip 300, the functional block 330 may operate in synchronization with the output clock signal O_CLK having a constant frequency, which is generated by the clock switch device 320. Therefore, the reliability of operation of the functional block 330 may effectively increase.

Figure 14:
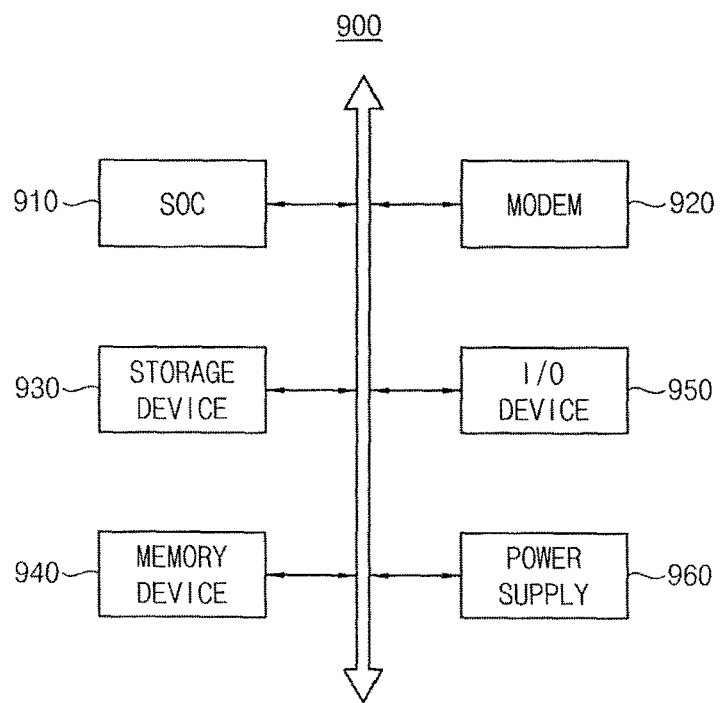
FIG. 14 illustrates an embodiment of a computing system.

FIG. 14 illustrates an embodiment of 900 which includes a system-on-chip SOC 910, a modem 920, a storage device 930, a memory device 940, an input/output device 950, and a power supply 960. The system-on-chip 910 controls overall operation of the computing system 900. The modem 920 communicates data with an external device through a wired or wireless communication.

The system-on-chip 910 in the computing system 900 in FIG. 14 may be implemented with the system-on-chip 300 of FIG. 13. Therefore, the functional block 330 in the system-on-chip 910 may operate in synchronization with the output clock signal O_CLK having a constant frequency, which is generated by clock switch device 320. Thus, reliability of operation of system-on-chip 910 may effectively increase.

The storage device 930 stores data received from the external device through the modem 920 and data to be transferred to the external device through the modem 920. The memory device 940 stores data for operation of the computing system 900. The input/output device 950 may include an input device such as a touch screen, a keypad, etc., and an output device such as a speaker, a display device, etc. The power supply 960 may supply an operational power.

The computing system 900 may be any computing system including the system-on-chip 910. For example, the computing system 900 may include a digital camera, a mobile phone, a smart phone, a laptop computer, a portable multimedia player (PMP), a personal digital assistant (PDA), a music player, a portable game console, a navigation system, etc.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The control circuits, blocks, buffers, modems, signal generators, and other processing features of the disclosed embodiments may be implemented in logic which, for example, may include hardware, software, or both. When implemented at least partially in hardware, the control circuits, blocks, buffers, modems, signal generators, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the control circuits, blocks, buffers, modems, signal generators, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one embodiment, an apparatus includes first logic to output a first control signal when a frequency of a clock signal is in a first state; and second logic to output a second control signal when the frequency of the clock signal is in a second state, wherein the first state corresponds to when the clock signal varies and the second state corresponds to when the clock signal is maintained. The first control signal has a first value (e.g., enable or disable signal) and the second control signal has a second value (e.g., the other of the enable or disable signal) which is complementary to the first value. The first logic and the second logic may correspond, for example, the control circuit and/or clock switch devices of the aforementioned embodiments. The first and second control signals are to control the output state of a buffer, e.g., a tri-state buffer in accordance with any of the aforementioned embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A clock switch device, comprising:
   a control circuit to receive a clock signal having an unstable frequency and a stable frequency, to deactivate an output enable signal when a frequency of the clock signal varies and has the unstable frequency and to activate the output enable signal when the frequency of the clock signal is maintained without change and has the stable frequency; and
   a tri-state buffer to receive the clock signal, to maintain an output electrode at a high impedance state when the output enable signal is deactivated and to buffer the clock signal and output the buffered clock signal through the output electrode as an output clock signal when the output enable signal is activated, wherein
   the unstable frequency of the clock signal has at least a higher frequency than the stable frequency of the clock signal.

2. The clock switch device as claimed in claim 1, wherein the control circuit is to deactivate the output enable signal when the control circuit starts to receive the clock signal and to activate the output enable signal after a first time duration from a time at which the control circuit starts to receive the clock signal.

3. The clock switch device as claimed in claim 2, wherein the first time duration is stored in a register in the control circuit.

4. The clock switch device as claimed in claim 2, wherein the control circuit is to receive the first time duration from an external device.

5. The clock switch device as claimed in claim 1, wherein the control circuit is to detect the frequency of the clock signal, deactivate the output enable signal when a change amount of the frequency of the clock signal is equal to or greater than a reference amount, and activate the output enable signal when the change amount of the frequency of the clock signal is less than the reference amount.

6. The clock switch device as claimed in claim 5, wherein the reference amount is stored in a register in the control circuit.

7. The clock switch device as claimed in claim 5, wherein the control circuit is to receive the reference amount from an external device.

8. The clock switch device as claimed in claim 1, wherein the tri-state buffer includes:
   a first p-type metal oxide semiconductor (PMOS) transistor including a source coupled to a supply voltage, a drain coupled to a first node, and a gate to receive the clock signal;
   a second PMOS transistor including a source coupled to the first node, a drain coupled to a second node, which corresponds to the output electrode, and a gate to receive an inverted version of the output enable signal;
   a first n-type metal oxide semiconductor (NMOS) transistor including a source coupled to a ground voltage, a drain coupled to a third node, and a gate to receive the clock signal; and a second NMOS transistor including a source coupled to the third node, a drain coupled to the second node, and a gate to receive the output enable signal.

9. The clock switch device as claimed in claim 1, wherein the tri-state buffer includes:
a first p-type metal oxide semiconductor (PMOS) transistor including a source coupled to a supply voltage, a drain coupled to a first node, and a gate to receive the clock signal;
a second PMOS transistor including a source coupled to the first node, a drain coupled to a second node, which corresponds to the output electrode, and a gate to receive an inverted version of the output enable signal; and
a first n-type metal oxide semiconductor (NMOS) transistor including a source coupled to a ground voltage, a drain coupled to the second node, and a gate to receive the clock signal.

10. The clock switch device as claimed in claim 1, wherein the tri-state buffer includes:
a first p-type metal oxide semiconductor (PMOS) transistor including a source coupled to a supply voltage, a drain coupled to a first node, which corresponds to the output electrode, and a gate to receive the clock signal;
a first n-type metal oxide semiconductor (NMOS) transistor including a source coupled to a ground voltage, a drain coupled to a second node, and a gate to receive the clock signal; and
a second NMOS transistor including a source coupled to the second node, a drain coupled to the first node, and a gate to receive the output enable signal.

11. The clock switch device as claimed in claim 1, wherein the tri-state buffer includes:
a first p-type metal oxide semiconductor (PMOS) transistor including a source coupled to a supply voltage, a drain coupled to a first node, and a gate to receive the clock signal;
a first n-type metal oxide semiconductor (NMOS) transistor including a source coupled to a ground voltage, a drain coupled to the first node, and a gate to receive the clock signal;
a second PMOS transistor including a source coupled to the first node, a drain coupled to a second node, which corresponds to the output electrode, and a gate to receive an inverted version of the output enable signal; and
a second NMOS transistor including a source coupled to the first node, a drain coupled to the second node, and a gate to receive the output enable signal.

12. A system-on-chip, comprising:
a clock signal generator to generate a clock signal having an unstable frequency and a stable frequency;
a clock switch device to receive the clock signal, to stop outputting the clock signal when a frequency of the clock signal varies and has the unstable frequency and to buffer the clock signal and output the buffered clock signal as an output clock signal when the frequency of the clock signal is maintained without change and has the stable frequency; and
a functional block to receive the output clock signal and to operate in synchronization with the output clock signal, wherein
the unstable frequency of the clock signal has a least a higher frequency than the stable frequency of the clock signal.

13. The system-on-chip as claimed in claim 12, wherein the clock switch device includes:
a control circuit to receive the clock signal, to deactivate an output enable signal when the frequency of the clock signal varies and to activate the output enable signal when the frequency of the clock signal is maintained without change; and
a tri-state buffer to receive the clock signal, to maintain an output electrode at a high impedance state when the output enable signal is deactivated and to buffer the clock signal and output the buffered clock signal through the output electrode as the output clock signal when the output enable signal is activated.

14. The system-on-chip as claimed in claim 13, wherein the control circuit is to deactivate the output enable signal during a first time duration from a time at which the clock signal generator starts to generate the clock signal and to activate the output enable signal after the first time duration.

15. The system-on-chip as claimed in claim 13, wherein the control circuit is to detect the frequency of the clock signal, deactivate the output enable signal when a change amount of the frequency of the clock signal is equal to or greater than a reference amount, and activate the output enable signal when the change amount of the frequency of the clock signal is less than the reference amount.

16. A clock switch device, comprising:
a control circuit to output a first control signal when a frequency of a clock signal is in a first state and has an unstable frequency and to output a second control signal when the frequency of the clock signal is in a second state and has a stable frequency, wherein the first state corresponds to when the clock signal varies and has the unstable frequency and the second state corresponds to when the clock signal is maintained and has the stable frequency; and
a buffer to receive the clock signal, to stop outputting the clock signal in response to the first control signal and to buffer the clock signal and output the buffered clock signal as an output clock signal in response to the second control signal, wherein
the unstable frequency of the clock signal has at least a higher frequency than the stable frequency of the clock signal.

17. The clock switch device as claimed in claim 16, wherein:
the first control signal has a first value; and
the second control signal has a second value which is complementary to the first value.

18. The clock switch device as claimed in claim 16, wherein the buffer is configured to maintain an output electrode at a high impedance state in response to the first control signal.

19. The clock switch device as claimed in claim 16, wherein the first and second control signals are to control the buffer.

20. The clock switch device as claimed in claim 19, wherein the first and second control signals are to control an output state of the buffer.

* * * * *